(12) United States Patent
Udagawa et al.

(10) Patent No.: US 7,416,574 B2
(45) Date of Patent: Aug. 26, 2008

(54) FILTER APPARATUS, EXPOSURE APPARATUS, AND DEVICE-PRODUCING METHOD

(75) Inventors: Kenji Udagawa, Ushiku (JP); Yoshitomo Nagahashi, Takasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/292,491

(22) Filed: Dec. 2, 2005

(65) Prior Publication Data
US 2006/0156927 A1 Jul. 20, 2006

Related U.S. Application Data

(63) Continuation of application No. PCT/JP2004/007629, filed on Jun. 2, 2004.

(30) Foreign Application Priority Data

Jun. 3, 2003 (JP) ............................. 2003-158643

(51) Int. Cl.
  A61G 10/00 (2006.01)
  A61G 11/00 (2006.01)
  A61G 13/00 (2006.01)

(52) U.S. Cl. .............................. 55/356; 55/467; 55/471; 55/472; 55/473; 55/485; 55/486; 55/350.1; 55/385.2; 55/DIG. 34; 95/287; 95/288; 96/417; 96/223; 454/187; 219/400; 600/21

(58) Field of Classification Search ............... 55/356, 55/385.2, 417–473, 485, 486, 350.1, DIG. 34; 95/287, 288, 8, 10, 14; 454/187; 96/417, 96/223, 420; 600/21; 219/400; 355/30; 358/514; 430/27; 101/425, 487; 347/93
See application file for complete search history.

(56) References Cited

U.S. PATENT DOCUMENTS

| | | | | |
|---|---|---|---|---|
| 3,505,989 A * | 4/1970 | Truhan | | 600/21 |
| 3,963,461 A * | 6/1976 | Stockford et al. | | 95/10 |
| 5,090,972 A * | 2/1992 | Eller et al. | | 95/10 |
| 5,591,244 A * | 1/1997 | Vross et al. | | 55/356 |
| 5,942,017 A * | 8/1999 | Van Winkle, Sr. | | 55/385.1 |
| 6,146,451 A | 11/2000 | Sakata et al. | | |
| 6,762,820 B2 | 7/2004 | Udagawa | | |
| 6,979,359 B2 * | 12/2005 | Laiti | | 55/356 |
| 2005/0108996 A1 * | 5/2005 | Latham et al. | | 55/385.2 |
| 2005/0115213 A1 * | 6/2005 | Lim et al. | | 55/385.2 |
| 2005/0268581 A1 * | 12/2005 | Nakano et al. | | 55/385.2 |

FOREIGN PATENT DOCUMENTS

| JP | 9-145112 | 6/1997 |
|---|---|---|
| JP | 9-145112 A | 6/1997 |
| JP | 9-273787 | 10/1997 |

(Continued)

Primary Examiner—Duane Smith
Assistant Examiner—Minh-Chau T. Pham
(74) Attorney, Agent, or Firm—Synnestvedt & Lechner, LLP

(57) ABSTRACT

A filter apparatus for improving gas temperature stability while maintaining a high impurity removal capacity. The filter apparatus includes a filter for removing impurities from a gas and a temperature adjuster for adjusting the temperature of the gas to a predetermined temperature. The filter apparatus further includes a humidity detector, arranged at the upstream side of the filter, for adjusting the humidity of the gas before the gas passes through the filter.

24 Claims, 5 Drawing Sheets

FOREIGN PATENT DOCUMENTS

| | | |
|---|---|---|
| JP | 9-273787 A | 10/1997 |
| JP | 2001-46822 | 2/2001 |
| JP | 2001-46822 A | 2/2001 |
| JP | 2002-158170 | 5/2002 |
| WO | 02053267 | 7/2002 |
| WO | WO 02/53267 | 7/2002 |
| WO | WO 02/053267 A1 | 7/2002 |

* cited by examiner

FILTER APPARATUS, EXPOSURE APPARATUS, AND DEVICE-PRODUCING METHOD

CROSS-REFERENCE TO RELATED APPLICATIONS

This application is a continuation application based upon International Patent Application No. PCT/JP2004/007629, filed on Jun. 2, 2004, the entire contents of which are incorporated herein by reference.

BACKGROUND OF THE INVENTION

The present invention relates to a filter apparatus for removing impurities from a gas and for adjusting the humidity of a gas. The present invention further relates to an exposure apparatus used in the photolithography step of a manufacturing process for various devices such as a semiconductor element, a liquid crystal display element, an imaging element, a thin-film magnetic head and the like. The present invention further relates to a device manufacturing method for manufacturing various devices.

In this type of exposure apparatus, an illumination optical system illuminates a mask, such as a reticle or a photomask, having a predetermined pattern with predetermined exposure light. Further, the exposure apparatus includes a projection optical system for projecting an image of the predetermined pattern onto a substrate (e.g., wafer, glass plate), to which a photosensitive material such as photoresist is applied, when illuminated by the illumination optical system. The illumination optical system and the projection optical system, which includes a plurality of optical elements such as a lens element and a mirror, are accommodated in a barrel.

The exposure apparatus is a very delicate apparatus and the temperature in the apparatus must be kept constant for each part of the exposure apparatus to function properly. In the prior art, the exposure apparatus is installed in a clean room of which the room temperature is adjustable, and the temperature distribution in the exposure apparatus is uniform due to the air, of which the temperature is controlled, drawn into the exposure apparatus from the clean room.

In such an exposure apparatus, progress has been made to shorten the wavelength of the exposure light so as satisfy the strong demand for miniaturization of circuit patterns in recent years. For instance, an exposure apparatus using a KrF excimer laser ($\lambda$=248 nm) in the far ultraviolet range or an ArF excimer laser ($\lambda$=193 nm) in the vacuum ultraviolet range as the exposure light has been recently developed.

However, the following problems arise when using exposure light having a short wavelength. Gas of an organic substance reacts with oxygen, water vapor, carbon hydride gas or exposure light in the space (e.g., the internal space of the barrel) through which the exposure light passes and produces a clouding substance on the surface of an optical element, such as a lens element, and acts as a light absorption substance that absorbs the exposure light.

In particular, when used as the exposure light, light having a short wavelength that is less than or equal to the wavelength of the ArF excimer laser, the absorption of the exposure light by the light absorption substance is greater than the exposure light of ultraviolet light, such as an i-line. Therefore, the energy of the exposure light may be significantly lowered before the exposure light reaches the substrate from the light source. In this manner, the throughput of the exposure apparatus is lowered and the product yield is lowered when the energy of the exposure light itself decreases or the transmissivity of the exposure light decreases due to the clouding of the optical element.

In the prior art, a chemical filter capable of removing the light absorption substance is arranged in the exposure apparatus to prevent the throughput from being lowered. The chemical filter removes the light absorption substance in the gas drawn into the space, including the light path for the exposure light. In order to perform temperature control in the exposure apparatus with higher accuracy, an exposure apparatus that has been developed draws air from the clean room into the exposure apparatus in a state in which the fluctuation range relative to the target temperature is controlled to be smaller. However, it has become apparent that even if the temperature of the air supplied to the chemical filter is adjusted in advance so as to be kept substantially constant, the fluctuation range relative to the target temperature of the air drawn into the exposure apparatus is enlarged compared to before the air passes through the chemical filter.

This is considered to be because of the exchange of moisture that occurs between the air and the chemical filter when the air passes through the chemical filter. More specifically, the chemical filter has a property for containing moisture at an amount in which the humidity of the chemical filter is balanced with the humidity of the gas. That is, the chemical filter has a property for containing more water as the humidity of the gas increases. Therefore, if air is heated by a temperature controller to decrease the relative humidity when adjusting the temperature of the air, the chemical filter disperses moisture and evaporative latent heat is removed from the chemical filter. As a result, the temperature of the air after passing through the chemical filter becomes lower than the temperature of the air before entering the chemical filter.

On the other hand, if the air is cooled with a cooler to increase the relative humidity when adjusting the temperature of the air, the chemical filter adsorbs and takes in the moisture thereby generating adsorption heat. As a result, the temperature of the air after passing through the chemical filter becomes higher than the temperature of the air before entering the chemical filter. Thus, the temperature of the air changes by passing through the chemical filter even if the temperature of the air is adjusted to a predetermined temperature before passing through the chemical filter.

The temperature of a clean room is presently adjusted with satisfactory accuracy. However, in many cases, the humidity of the clean room is not sufficiently adjusted in terms of the control range or control cycle etc. Further, an enormous equipment investment would become necessary to perform humidity management in a large clean room with satisfactory accuracy.

A technique for connecting an environment controller to an exposure apparatus and controlling the environment inside the exposure apparatus has also been proposed (refer to for example, Japanese Laid-Open Patent Publication No. 2002-158170). In the environment control apparatus, a plurality of chemical filters for removing a light absorption substance are arranged along the circulation direction of the air. In the exposure apparatus, the amount of moisture exchanged between the air and the chemical filter decreases towards the downstream in the circulation direction of the air. Therefore, the fluctuation change relative to the target temperature of the air passing through the environment control apparatus is small, and the temperature of the air is substantially maintained at a target value.

There are many types of chemical filters including those made of activated carbon, ion exchange fabric etc., and the amount of moisture exchanged between air and the chemical filter differs depending on the material of the chemical filter. Therefore, in an exposure apparatus connected to the environment controller, the type of chemical filter must be selected comprehensively taking into consideration various aspects such as the capacity for removing the light absorption substance, the amount of moisture exchanged between the air and the chemical filter and the like. This may narrow the chemical filters that can be selected.

Further improvement in the exposure accuracy of the exposure apparatus is necessary for exposure apparatuss to correspondence with exposure light that will have even shorter wavelengths in the future. In order to satisfy this requirement, the temperature of the air drawn into the exposure apparatus must be more stable, and it is essential to control not only the temperature but also the humidity of the air with higher accuracy.

SUMMARY OF THE INVENTION

The present invention focuses on the problems of the prior art. It is an object of the present invention to provide a filter apparatus that improves temperature stability of a gas while maintaining a high impurity removing capacity. Further, it is an object of the present invention to provide an exposure apparatus that obtains a higher and more stable exposure precision. Moreover, it is an object of the present invention to provide a method for manufacturing a high integration device with efficiency.

A first aspect of the present invention is a filter apparatus including a filter configured to remove impurities contained in a gas, a temperature adjustment apparatus configured to adjust the temperature of the gas to a predetermined temperature and a humidity adjustment apparatus, arranged at the upstream side of the filter, for adjusting the humidity of the gas before the gas passes through the filter.

A second aspect of the present invention is an exposure apparatus for transferring an image of a pattern formed on a mask onto a substrate. The exposure apparatus includes a filter apparatus configured to drawn in gas from a clean room. The filter apparatus includes a filter that removes impurities from the gas, a temperature adjustment apparatus that adjusts the temperature of the gas to a predetermined temperature, and a humidity adjustment apparatus, arranged at the upstream side of the filter, for adjusting the humidity of the gas before the gas passes through the filter.

A third aspect of the present invention is an exposure system including an exposure apparatus configured to transfer an image of a pattern formed on a mask onto a substrate, a filter apparatus configured to drawn in gas from a clean room and supply the drawn in gas to the exposure apparatus. The filter apparatus includes a filter that removes impurities from the gas, a temperature adjustment apparatus that adjusts the temperature of the gas to a predetermined temperature, and a humidity adjustment apparatus, arranged at the upstream side of the filter, for adjusting the humidity of the gas.

A fourth aspect of the present invention is a device manufacturing method including a lithography step. The device manufacturing method includes performing exposure in the lithography step with the exposure apparatus of the second aspect.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

A filter apparatus for removing impurities from air, an exposure apparatus for manufacturing semiconductor devices, and a method for manufacturing semiconductor devices according to a first embodiment of the present invention will now be described with reference to FIGS. 1 to 3.

Figure 1:
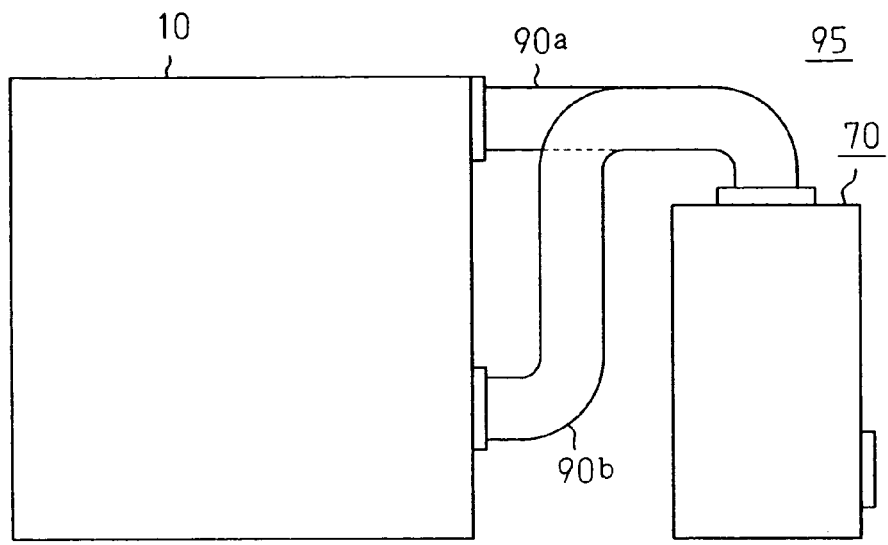
FIG. 1 is a schematic diagram showing a filter apparatus and an exposure apparatus according to a first embodiment of the present invention.

As shown in FIG. 1, an exposure apparatus 10 is connected to a filter apparatus 70 by ducts 90a and 90b. The ducts 90a and 90b are formed from material that produces only a small production amount of contaminants, such as stainless steel (SUS) or fluorocarbon resin. Such contaminants collect on the surface of various types of optical elements and lower the optical capacity of the optical elements. The exposure apparatus 10 and the filter apparatus 70 are arranged in a clean room 95 that can be adjusted to a predetermined temperature.

Figure 3:
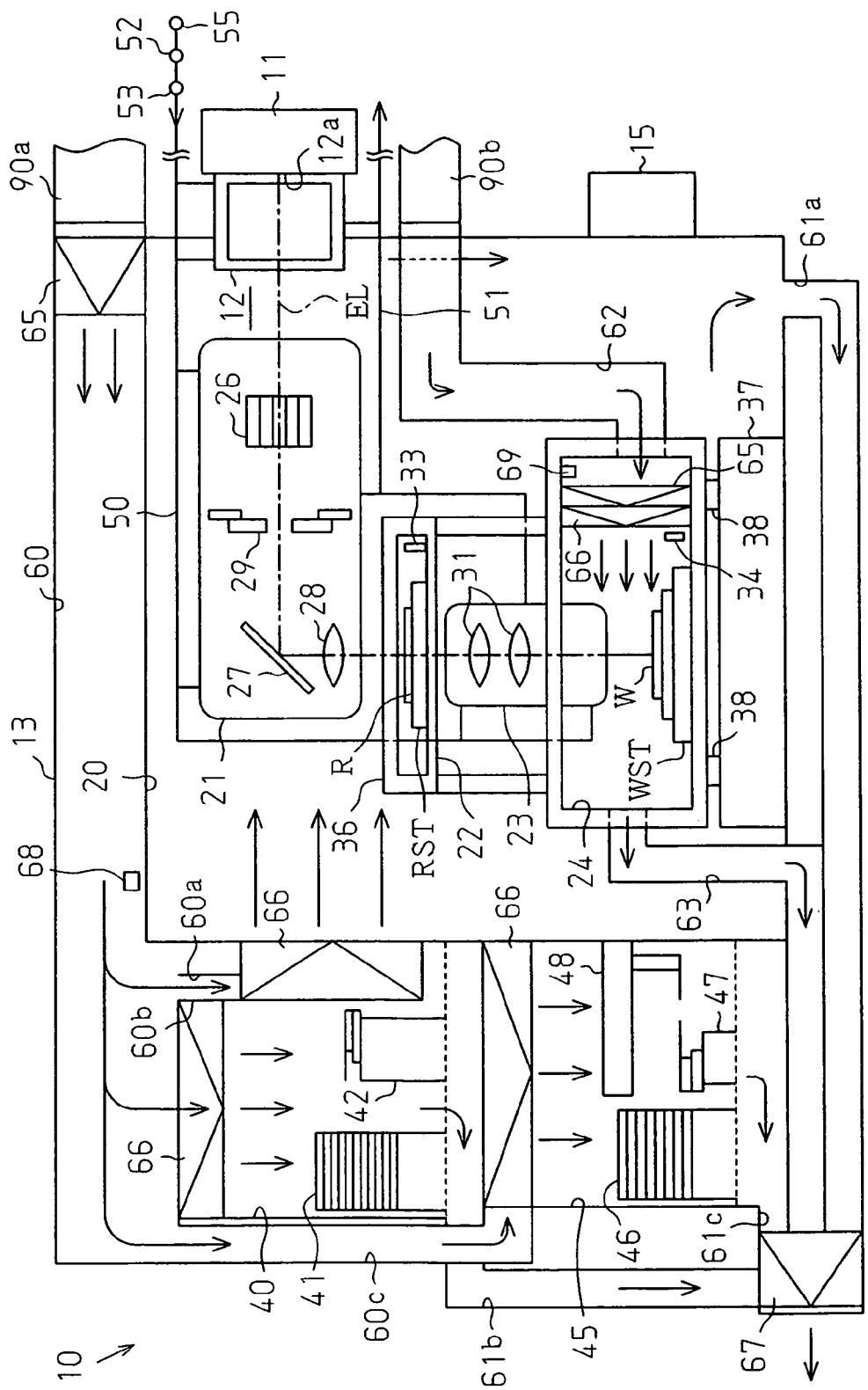
FIG. 3 is a schematic diagram showing the exposure apparatus of FIG. 1.

As shown in FIG. 3, the exposure apparatus 10 includes an exposure light source 11, a beam matching unit (hereinafter referred to as "BMU") 12, and a main body chamber 13. The exposure light source 11 is a laser light source for emitting, for example, KrF excimer laser ($\lambda$=248 nm) as the exposure light EL. The BMU 12 includes a plurality of optical elements, which are housed in a BMU compartment 12a. The BMU 12 optically connects the exposure light source 11 to the main body chamber 13, and the exposure light EL exiting the exposure light source 11 is guided to the main body chamber 13 by the BMU 12. The exposure light source 11 may be arranged in the clean room 95 or in a utility room formed under the floor of the clean room 95.

The exposure apparatus 10 transfers the image of a pattern formed on a reticle R, which functions as a mask, onto a wafer W, which serves as a substrate, by irradiating the exposure light EL inside the main body chamber 13. The structure of the main body chamber 13 will now be briefly described.

An exposure compartment 20 defining an exposure space through which the exposure light EL passes, a reticle loader compartment 40 housing the plurality of reticles R, and a wafer loader compartment 45 housing the plurality of wafers W, are formed in the main body chamber 13.

An illumination system barrel 21, a reticle compartment 22, a projection system barrel 23, and a wafer compartment 24, are sequentially arranged in the exposure compartment 20 in the direction of the optical axis of the exposure light EL guided by the BMU 12.

The illumination optical system for illuminating the reticle R arranged in the light path of the exposure light EL is accommodated in the illumination system barrel 21. The illumination optical system includes optical elements such as a fly's eye lens (or rod integrator) 26 functioning as an optical integrator, a mirror 27, and a condenser lens 28. The fly's eye lens 26 has a rear surface forming a plurality of secondary light sources for illuminating the reticle R at a uniform illuminance distribution when receiving the exposure light EL from the exposure light source 11. The reticle blind 29 for shaping the exposure light EL is arranged at the rear side of the fly's eye lens 26.

A disk-shaped parallel flat plate glass (not shown) forming part of an optical element in the illumination optical system is arranged at the entrance and exit of the exposure light EL in the illumination system barrel 21. The parallel flat plate glass is formed by a substance (synthetic quartz, fluorite etc.) that transmits the exposure light EL.

A projection optical system for projecting the image of the pattern on the reticle R, illuminated by the illumination optical system, onto the wafer arranged in the light path of the exposure light EL is accommodated inside the projection system barrel 23. The projection optical system includes a pair of cover glasses (not shown), respectively arranged at the entrance and exit of the exposure light EL in the projection system barrel 23, and a plurality of (only two are shown in this example) lens elements 31 arranged between the pair of cover glasses. The projection optical system forms the projected image of the circuit pattern on the reticle R reduced to ⅕, ¼ etc. on the wafer W, the surface to which a photoresist having photosensitivity with respect to the exposure light EL is applied.

A reticle stage RST is arranged inside the reticle compartment 22. The reticle stage RST holds the reticle R, which has a predetermined pattern, to be movable within a plane orthogonal to the optical axis of the exposure light EL. A movable mirror for reflecting the laser beam from a reticle interferometer 33 is fixed at the end of the reticle stage RST. The position of the reticle stage RST in the scanning direction is constantly detected by the reticle interferometer 33, and the reticle stage RST is driven in a predetermined scanning direction under the control of a controller 15 that controls the operation of the entire exposure apparatus 10.

A wafer stage WST is arranged inside the wafer compartment 24. The wafer W, to which photoresist having photosensitivity with respect to the exposure light EL is applied, is held by the wafer stage WST so as to be movable within a plane orthogonal to the optical axis of the exposure light EL and to be finely movable along the optical axis of the exposure light EL. A movable mirror for reflecting a laser beam from a wafer interferometer 34 is fixed at the end of the wafer stage WST, and the position in the plane in which the wafer stage WST is movable is constantly detected by the wafer interferometer 34. The wafer stage WST moves not only in the scanning direction but also in a direction perpendicular to the scanning direction under the control of the controller 15. This structure enables a step and scan operation for repeating scanning and exposure for each shot region of the wafer.

The step and scan method shapes the illumination region of the reticle R into a rectangular (slit) shape with the reticle blind 29 when scanning and exposing the shot region of the wafer W with the circuit pattern of the reticle R. The illumination region is extended along a direction orthogonal to the scanning direction at the side of the reticle R. The circuit pattern of the reticle R is sequentially illuminated from one end towards the other end with the slit-shaped illumination region by scanning the reticle R at a predetermined velocity Vr during exposure. Through such illumination, the circuit pattern of the reticle R in the illumination region is projected onto the wafer by the projection optical system to form a projection region.

Due to the inverted imaging relationship with the reticle R, the wafer W is scanned at a predetermined velocity Vw in synchronization with the scanning of the reticle R in a direction opposite to the scanning direction of the reticle R. The entire surface of the shot region of the wafer W is exposed by such scanning. The ratio Vw/Vr of the scanning velocities corresponds to the reducing magnification of the projection optical system, and the circuit pattern of the reticle R is accurately reduced and transferred to each shot region of the wafer W.

In the exposure apparatus 10, the reticle compartment 22 and the wafer compartment 24 are formed in a main body column 36 accommodated in the exposure compartment 20. The main body column 36 holds the projection system barrel 23 so that one of its ends is arranged in the reticle compartment 22 and the other end is arranged in the wafer compartment 24. The main body column 36 is supported on the base plate 37 installed at the bottom surface of the exposure compartment 20 by a plurality of (only two are shown in FIG. 3) vibration prevention platforms 38.

A supply pipe 50 and a discharge pipe 51 are connected to each of the BMU compartment 12a, the illumination system barrel 21, and the projection system barrel 23. Inart gas, which is an optically inactive purge gas, is supplied into the BMU compartment 12a, the illumination system barrel 21, and the projection system barrel 23 from a tank 55 in a utility plant of a micro-device factory by the supply pipe 50. The gas inside the BMU compartment 12a, the illumination system barrel 21, and the projection system barrel 23 is discharged out of the factory through the discharge pipe 51.

The inert gas is, for example, one of the gases selected from nitrogen, helium, neon, argon, krypton, xenon, and radon or a mixture of these substances, and is chemically purified. This purge gas is supplied to reduce the concentration of impurities such as moisture, organic compound and the like that contaminates various optical elements inside the BMU compartment 12a, the illumination system barrel 21, and the projection system barrel 23. The moisture and the organic compound are substances deposited on the surface of various optical elements when irradiated by the exposure light EL thereby causing the clouding phenomenon, and oxygen is a light absorption substance that absorbs the KrF excimer laser.

Moisture, organic compounds, or oxygen may be contained in the purge gas as impurities. Thus, the supply pipe 50 includes a purge gas filter 52, for removing impurities from the purge gas, and a temperature adjustment dryer 53, for adjusting the temperature of the purge gas to a predetermined temperature and removing moisture from the purge gas.

The organic compounds include volatile compounds produced from organic silicide, ammonium salt, hydrosulfate, and the resist on the wafer; volatile compounds produced from lubricant agents used for components including various types of moving parts; and volatile compounds produced from covering layers of the wiring for supplying power or signals to the electrical components in the main body chamber 13. The supply pipe 50 and the discharge pipe 51 may also be connected to the reticle compartment 22, and the purge gas may be supplied to the reticle compartment 22.

A reticle library 41 for storing a plurality of reticles R and a reticle loader 42 or a horizontal multi-joint robot arranged closer to the exposure compartment 20 than the reticle library 41 are accommodated in the reticle loader compartment 40. The reticle loader 42 transports one of the reticles R stored in the reticle library 41 onto the reticle stage RST, and transports the reticle R on the reticle stage RST into the reticle library 41.

A closed cassette (container) of a bottom open type that can house, for example, a plurality of reticles R may be used in lieu of the reticle library 41. Further, a device having, for example, a mechanism for sliding the transportation arm may be used as the reticle loader 42. The reticle library 41 may be arranged in a compartment differing from the reticle loader compartment 40. In this structure, the above described closed cassette is arranged in the upper part of the reticle loader compartment 40, and the reticle R is transported into the reticle loader compartment 40 with the bottom open maintained in a hermetic state.

A wafer carrier 46 for storing a plurality of wafers W, a horizontal multi-joint robot 47 for loading and unloading the wafers W to and from the wafer carrier 46, and a wafer transportation apparatus 48 for transporting the wafer W between the horizontal multi-joint robot 47 and the wafer stage WST are accommodated in the wafer loader compartment 45.

The wafer transportation apparatus 48 may be omitted, and the wafer W may be transported between the wafer carrier 46 and the wafer stage WST by the horizontal multi-joint robot 47. Further, the wafer carrier 46 may be arranged in a compartment differing from the wafer loader compartment 45.

A guide passage 60 for guiding air drawn into the filter apparatus 70 from the clean room 95 through the duct 90a and into the exposure compartment 20, the reticle loader compartment 40, and the wafer loader compartment 45 is arranged inside the main body chamber 13. The guide passage 60 is branched into three parts, with branched portions 60a to 60c respectively connected to the compartments 20, 40, and 45. Exhaust passages 61a to 61c for guiding the gas in the exposure compartment 20, the reticle loader compartment 40, and the wafer loader compartment 45 out of the main body chamber 13 are arranged inside the main body chamber 13.

Further, an introducing passage 62 for introducing the air in the clean room 95 to the wafer compartment 24 from the filter apparatus 70 through the duct 90b is arranged inside the main body chamber 13. The introducing passage 62 extends through the exposure compartment 20 and connects to the main body column 36. An exhaust passage 63 for guiding the gas in the wafer compartment 24 out of the main body chamber 13 is arranged inside the main body chamber 13.

A chemical filter 65 is arranged in the upstream part of the guide passage 60 to remove from the air drawn in from the filter apparatus 70 contaminants in a gaseous state, such as organic compounds, that collect on the surfaces of various types of optical elements thereby lowering the optical capacities of the optical elements.

In the present embodiment, instead of the various optical elements arranged in the light path of the exposure light, a specific optical element having a surface exposed to the main body chamber 13, among the optical elements forming the projection optical system, in particular, an optical element facing the reticle or an optical element facing the wafer surface may be given attention as the optical element on which organic substances collect.

It is desirable for the chemical filter 65 to remove alkaline substances that react with the photoresist (photo-sensitive material) applied to the wafer. A photoresist referred to as a chemically amplified type photoresist having superior pattern formation characteristics and resolution may be used for the KrF excimer laser or a light of a shorter wavelength range.

The chemically amplified photoresist is generally formed of components such as resin, photosensitive acid forming agent, solubility accelerating agent or cross linking agent, and produces acid formed from the acid forming agent during exposure. The acid acts as a catalyst during baking (PEB) subsequent to exposure and accelerates the reaction of the solubility accelerating agent or the cross linking agent thereby forming a pattern through developing. A positive type pattern is formed when the solubility accelerating agent is used, and a negative type pattern is formed when the cross linking agent is used. The chemically amplified photoresist is superior in terms of resolution. However, if gas such as ammonium or amine exists in the air during the period between exposure and PEB, the generated acid reacts and escapes into the air. This applies a slightly soluble layer on the photoresist surface. If the slightly soluble layer is applied, the formed pattern is T-shaped and has an upper portion with a "shade" (referred to as T-top phenomenon). This greatly hinders subsequent processes such as etching. For this reason, it is desirable that the chemical filter 65 have a function for removing alkaline substances such as ammonium or amine.

Contaminants in a gaseous state and the alkaline substance are hereinafter collectively referred to as impurities in the air.

Any of a filter for removing gaseous alkali substance, a filter for removing gaseous acid substance, and a filter for removing gaseous organic substance may be used as the chemical filter 65. Further, for example, an activated carbon filter (for removing gaseous organic substances), an impregnated activated carbon filter (for removing gaseous alkaline substances and gaseous acid substances), an ion exchange fabric filter (for removing gaseous alkaline substances and gaseous acid substances), an ion exchange resin filter (for removing gaseous alkaline substances and gaseous acid substances), a ceramic filter (for removing gaseous organic substances), an impregnated ceramic filter (for removing gaseous alkaline substances and gaseous acid substances) may be used as the chemical filter 65. The chemical filter 65 may be any one of the above types, and may be used alone or in combination.

An upstream filter box 66 for removing fine particles (particles) in the air is arranged at portions connected to each compartment 20, 40, and 45 in each branched portion 60a to 60c of the guide passage 60. The upstream filter box 66 includes an ULPA filter (Ultra Low Penetration Air-filter) and a filter plenum. The upstream filter box 66 arranged at the branched portion 60a connected to the exposure compartment 20 is arranged so as to allow the transportation of the reticle R between the reticle loader compartment 40 and the reticle compartment 22.

A downstream filter box 67 for removing fine particles (particles) in the gas and including the ULPA filter and the filter plenum is arranged at an intersecting portion of the exhaust passages 61a to 61c and the exhaust passage 63.

The chemical filter 65 and the upstream filter box 66 are arranged in the circulation direction of the air near the portion connecting the main body column 36 and the introducing passage 62 inside the wafer compartment 24.

A guide passage temperature sensor 68 for detecting the temperature of the air circulating through the guide passage 60 is arranged upstream of the branched portions 60a to 60c in the guide passage 60. A wafer compartment temperature sensor 69 for detecting the temperature of the air drawn into the wafer compartment 24 is arranged between the chemical filter 65 and the introducing passage 62 in the wafer compartment 24. Both temperature sensors 68 and 69 are connected to the controller 15 and send detection signals indicating the temperature of the detected air to the controller 15.

The filter apparatus 70 adjusts the air in the clean room 95 to a predetermined temperature and removes impurities from the air and supplies the air into the main body chamber 13 of the exposure apparatus 10.

Figure 2:
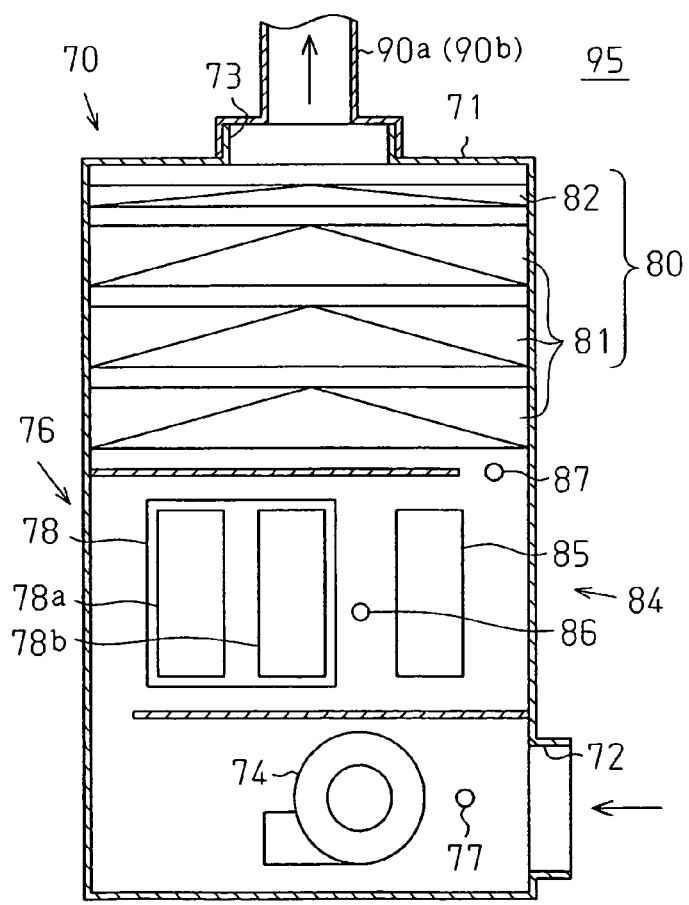
FIG. 2 is a schematic diagram showing the filter apparatus of FIG. 1.

In the first embodiment, the filter apparatus 70 includes an apparatus main body 71 having an inlet port 72, through which the air of the clean room 95 is drawn, and a discharge port 73, through which the drawn in air is discharged, as shown in FIG. 2.

A fan motor 74 for drawing air into the apparatus main body 71 of the clean room 95 and forcibly sending the drawn in air downstream is arranged in the vicinity of the inlet port 72 of the apparatus main body 71.

A temperature adjustment apparatus 76 for adjusting the temperature of the air drawn in through the inlet port 72 to a predetermined temperature is arranged inside the apparatus main body 71. The temperature adjustment apparatus 76 includes an apparatus temperature sensor 77, functioning as a temperature detector for detecting the temperature of the drawn in air, and a temperature adjuster 78, provided with a cooler 78a and a heater 78b. In the first embodiment, the apparatus temperature sensor 77 is arranged at the upstream side of the cooler 78a and the heater 78b. Specifically, the apparatus temperature sensor 77 is arranged upstream of the fan motor 74, and the cooler 78a and the heater 78b are arranged downstream of the fan motor 74. The cooler 78a is arranged upstream of the heater 78b. The cooler 78a may be arranged downstream of the heater 78b. Alternatively, the cooler 78a and the heater 78b may be arranged at the same position with respect to the circulation direction of the air.

The apparatus temperature sensor 77, the cooler 78a, and the heater 78b are connected to the controller 15. Based on the detection result in the apparatus temperature sensor 77, the controller 15 controls the temperature of the air so that the temperature of the air matches the target value through cooling with the cooler 78a and heating with the heater 78b. In the first embodiment, the temperature of the air passing through the temperature adjuster 78 is controlled by the controller 15 so as to be within a range of, for example, 20° C. to 30° C. and substantially constant (e.g., 23° C.).

A filter 80 for removing impurities from the air drawn into the apparatus main body 71 is arranged in the vicinity of the discharge port 73 of the apparatus main body 71. The filter 80 includes chemical filters 81, functioning as filter materials for removing impurities from the air, and an ULPA filter 82, for removing fine particles (particles) from the air. In the first embodiment, three chemical filters 81 and one ULPA filter 82 are used. The chemical filters 81 are arranged at the upstream side of the ULPA filter 82 in the apparatus main body 71 so that air passes through the ULPA filter 82 after sequentially passing through the three chemical filters 81.

In the first embodiment, an activated carbon filter, an impregnated activated carbon filter, and an ion exchange resin filter may be combined. Alternatively, an activated carbon filter, an ion exchange fabric filter (for removing gaseous acid substances), and an ion exchange fabric filter (for removing gaseous alkaline substances) may be combined to form the chemical filter 81. The chemical filter 81 may be formed from the same materials as the chemical filter 65 arranged in the guide passage 60 of the exposure apparatus 10. These materials may be used alone or any number of materials may be combined to form the chemical filter 81. The positions of the chemical filters 81 and the ULPA filter 82 are not limited to those shown in FIG. 2, and the ULPA filter 82 may be arranged at the upstream side of the chemical filter 81. Alternatively, the ULPA filter 82 may be arranged between the chemical filters 81. The combination of the chemical filter 81 is may be selected in any manner in accordance with the impurities contained in the air drawn into the filter apparatus 70, that is, the air in the clean room 95. It is preferable that the combination of the chemical filters 81 be determined after conducting a gas analysis on the air in the clean room 95 in which the filter apparatus 70 is installed.

In addition, a humidity adjustment apparatus 84, arranged upstream of the filter 80, for adjusting the humidity of the air before it passes through the filter 80 is arranged in the apparatus main body 71.

The humidity adjustment apparatus 84 includes a humidity adjuster 85 and an upstream humidity sensor 86, arranged upstream of the humidity adjuster 85 and functioning as a first humidity detector for detecting the humidity of the air. The humidity adjustment apparatus 84 also includes a downstream humidity sensor 87 functioning as a second humidity detector for detecting the humidity of the air after passing through the humidity adjuster 85 and before passing through the filter 80. In the first embodiment, the humidity adjuster 85 is arranged at the downstream side of the temperature adjustment apparatus 76, specifically, between the temperature adjuster 78 of the temperature adjustment apparatus 76 and the filter 80. The upstream humidity sensor 86 is arranged between the temperature adjuster 78 and the humidity adjuster 85, and the downstream humidity sensor 87 is arranged between the humidity adjuster 85 and the filter 80. The humidity adjuster 85 is provided with a humidifying function and a dehumidifying function.

In the first embodiment, the upstream humidity sensor 86 and the downstream humidity sensor 87 detect the relative humidity of the air. For example, variable impedance/capacity type, electromagnetic wave absorption type, heat conduction application type, and quartz oscillating type sensors may be used as the humidity sensors 86 and 87 in accordance with the humidity measuring method.

The humidity adjuster 85, the upstream humidity sensor 86, and the downstream humidity sensor 87 are connected to the controller 15. The controller 15 adjusts the humidifying amount and the dehumidifying amount in the humidity adjuster 85 based on the detection result of the upstream humidity sensor 86 and controls the humidity of the air so that the humidity of the air is kept substantially constant. In the first embodiment, the relative humidity of the air after passing through the humidity adjuster 85 but before passing through the filter 80 is within a range of 20% to 95%, preferably 40% to 60%, and more preferably 45% to 55% and is maintained to be substantially constant (e.g. 50%). The downstream humidity sensor 87 monitors the humidity of the air adjusted in the humidity adjuster 85. Further, the controller 15 may use the detection results of both of the upstream humidity sensor 86 and the downstream humidity sensor 87 so that the humidity of the air is adjusted to be constant.

Air conditioning in the exposure apparatus 10, which is connected to the filter apparatus 70, may be performed as described below.

When the fan motor 74 in the filter apparatus 70 is activated, the air in the clean room 95 is drawn into the apparatus main body 71 through the inlet port 72 by the drawing force produced by the fan motor. When the air that has been drawn in passes through the apparatus temperature sensor 77, the temperature of the passing air is detected by the apparatus temperature sensor 77 and the detection signal is input to the controller 15. The air that has passed by the apparatus temperature sensor 77 is then forcibly sent downstream by the fan motor 74.

If the temperature of the air detected by the apparatus temperature sensor 77 is higher than the target value, the controller 15 activates the cooler 78a. On the other hand, if the temperature of the air detected by the apparatus temperature sensor 77 is lower than the target value, the controller 15 activates the heater 78b. If the temperature of the air detected by the apparatus temperature sensor 77 is the same as the target value, the controller 15 does not activate the cooler 78a nor the heater 78b. Therefore, the temperature of the air sent downstream by the fan motor 74 is adjusted to a predetermined temperature (target value) when the air passes through the temperature adjuster 78.

When the air adjusted to a predetermined temperature in this way passes by the upstream humidity sensor 86, the relative humidity of the passing air is detected by the upstream humidity sensor 86, and the detection signal representing the relative humidity of the air is input to the controller 15.

If the relative humidity of the air detected by the upstream humidity sensor 86 is lower than the target value, the controller 15 activates the humidity adjuster 85 and humidifies the air. If the relative humidity of the air detected by the upstream humidity sensor 86 is higher than the target value, the controller 15 activates the humidity adjuster 85 and dehumidifies the air. Further, if the relative humidity of the air detected by the upstream humidity sensor 86 is the same as the target value, the controller 15 does not activate the humidity adjuster 85. Therefore, the temperature of the air that has passed the upstream humidity sensor 86 is adjusted to a predetermined relative humidity (target value) when the air passes by the humidity adjuster 85.

When the air that has passed by the humidity adjuster 85 passes by the downstream humidity sensor 87, the relative humidity of the passing air is detected by the downstream humidity sensor 87 and the detection signal is input to the controller 15. If the relative humidity of the air detected by the downstream humidity sensor 87 is lower than the target value, the controller 15 continuously activates the humidity adjuster 85 to humidify the air so that the relative humidity of the air matches a predetermined relative humidity (target value).

The temperature and humidity of the air that has passed by the temperature adjuster 78 and the humidity adjuster 85 are adjusted so that the temperature and the relative humidity both substantially match the target value. Such air, first sequentially passes through the three chemical filters 81. Contaminated impurities (gaseous alkaline substances, gaseous acid substances, and gaseous organic substances) in the air are almost completely adsorbed and removed by the chemical filters 81. The air that has passed through the chemical filter 81 subsequently passes through the ULPA filter 82. The fine particles (particles) in the air are then almost completely adsorbed and removed by the ULPA filter 82.

Clean air from which impurities and fine particles (particles) in the air are almost completely removed in this manner is drawn into the main body chamber 13 of the exposure apparatus 10 through the discharge port 73 and the ducts 90a, 90b of the apparatus main body 71.

In the first embodiment, the amount of air passing through the duct 90a is greater than the amount of air passing through the duct 90b. Specifically, the amount of air passing through the duct 90a is set to be four times greater than the amount of air passing through the duct 90b. The ratio between the amount of air passing through the duct 90a and the amount of air passing through the duct 90b can be appropriately changed, for example, in accordance with the volume of the space to which the air is supplied.

The air drawn into the main body chamber 13 through the duct 90a flows into the exposure compartment 20, the reticle loader compartment 40, and the wafer loader compartment 45 through the guide passage 60. When the air flows into each of the compartments 20, 40, and 45, the air passes through the chemical filter 65 and the upstream filter box 66 so that the impurities and fine particles (particles) in the air are more completely absorbed and removed.

When air passes by the temperature sensor 68 in the guide passage 60, the temperature of the passing air is detected by the temperature sensor 68 in the guide passage 60 and the detection signal is input to the controller 15. If the temperature of the air passing by the temperature sensor 68 in the guide passage differs from the target value, the controller 15 activates the temperature adjustment apparatus 76 of the filter apparatus 70 to adjust the temperature of the air passing through the filter apparatus 70.

The temperatures in the compartments 20, 40, and 45 are constantly adjusted so as to be constant by drawing air from the filter apparatus 70 into each of the compartment 20, 40, and 45. With the air pressure in each compartment 20, 40, and 45 increased by the drawn in air, some of the gas in each compartment 20, 40, and 45 flows into the exhaust passages 61a to 61c. The gas in the exhaust passages 61a to 61c passes through the downstream filter box 67 and is discharged out of the main body chamber 13, that is, into the clean room 95.

The air drawn into the main body chamber 13 from the duct 90b passes through the introducing passage 62 and flows into the wafer compartment 24. When the air flows into the wafer compartment 24, the air passes through the chemical filter 65 and the upstream filter box 66. This adsorbs and removes impurities and fine particles (particles) more completely from the air.

The temperature of the passing air is detected by the temperature sensor 69 in the wafer compartment, and the detection signal is input to the controller 15 when the air in the introducing passage 62 passes by the temperature sensor 69 in the wafer compartment. If the temperature of the air passing through the temperature sensor 69 in the wafer compartment differs from the target value, the controller 15 activates the temperature adjustment apparatus 76 of the filter apparatus 70 to adjust the temperature of the air passing through the filter apparatus 70.

The temperature of the wafer compartment 24 is adjusted by drawing air into the wafer compartment 24. If the air pressure in the wafer compartment 24 is high due to the drawn in air, some of the gas in the wafer compartment 24 flows into the exhaust passage 63. The air that flows into the exhaust passage 63 passes through the downstream filter box 67 and is discharged out of the main body chamber 13, that is, into the clean room 95.

The filter apparatus 70 includes moving components such as the fan motor 74, and the exposure apparatus 10 includes moving components such as the reticle blind 29, the reticle stage RST, and the wafer stage WST. A lubricant agent is used for the sliding portions of the moving components. In the first embodiment, a substance in which the production of volatile compounds (organic substances such as carbides) is suppressed, such as fluorinated grease, is used for the lubricant agent. The amount of volatile compound produced when heating about 10 mg of fluorinated grease for 10 minutes at 60° C. in a nitrogen atmosphere is, for example, less than or equal to $150\,\mu g/M^3$ in a toluene converted value. Particularly, the amount of volatile compound produced in the above heating condition is desirably less than or equal to $100\,\mu g/M^3$, and more desirably, less than or equal to $40\,\mu g/m^3$ in a toluene converted value for the fluorinated grease used in the exposure apparatus 10. For example, DEMNUM (product name) manufactured by Daikin Industries, Ltd. may be used as the grease of $40\,\mu g/M^3$.

The production of volatile compound from the grease may be suppressed by using the fluorinated grease for the sliding portions of the various moving components arranged in the filter apparatus 70 and the exposure apparatus 10. Therefore, the chemical filter 81 in the filter apparatus 70 and the chemical filter 65 in the exposure apparatus 10 may be used for a long period of time.

The filter apparatus 70 of the first embodiment has the advantages described below.

(1) In the filter apparatus 70 of the first embodiment, the humidity adjustment apparatus 84 for adjusting the relative humidity of the air before passing through the filter 80 is arranged at the upstream side of the filter 80.

The humidity of the air passing through the filter apparatus 70 is adjusted to a predetermined relative humidity (target value) by the humidity adjustment apparatus 84. This decreases changes in the relative humidity change of the air. Therefore, when the air passes through the filter 80, the amount of moisture exchanged between the air and the filter 80 is reduced, and the generation of adsorption heat or vapor latent heat originating from the exchange of moisture is suppressed. The range of temperature change with respect to the target temperature in the air passing through the filter 80 thus becomes small. This improves the temperature stability of the air.

Further, the filter 80 having a high capacity for removing gaseous contaminants from air is used irrespective of the degree of absorption amount and evaporation amount of the moisture. Therefore, the removal capacity for the gaseous contaminants in the air passing through the filter apparatus 70 is kept high.

(2) In the filter apparatus 70 of the first embodiment, the humidity adjustment apparatus 84 includes the upstream humidity sensor 86, for detecting the relative humidity of the air, and the humidity adjuster 85, for adjusting the relative humidity of the air based on the detected result in the upstream humidity sensor 86. Further, the upstream humidity sensor 86 is arranged at the upstream side of the humidity adjuster 85. The relative humidity of the air is detected by the upstream humidity sensor 86 before the air in the filter apparatus 70 passes through the humidity adjuster 85. If the relative humidity of the gas passing through the upstream humidity sensor 86 is lower than the target value, the humidity adjuster 85 rapidly humidifies the air so that the relative humidity of the air becomes the same as the target value based on the detected result of the upstream humidity sensor 86. Further, if the relative humidity of the gas passing through the upstream humidity sensor 86 is higher than the target value, the humidity adjuster 85 rapidly dehumidifies the air so that the relative humidity of the air becomes the same as the target value based on the detected result of the upstream humidity sensor 86. This improves the adjustment accuracy of the relative humidity of the air.

(3) In the filter apparatus 70 of the first embodiment, the downstream humidity sensor 87 detects the relative humidity of the air after passing through the humidity adjuster 85 and before passing through the filter 80. The relative humidity of the air after passing through the humidity adjuster 85 is detected by the downstream humidity sensor 87. The relative humidity of the air is rapidly adjusted by the humidity adjuster 85 when the relative humidity of the air differs from the target value based on the detected result of the downstream humidity sensor 87. This improves the adjustment accuracy of the relative humidity of the air.

(4) In the filter apparatus 70 of the present embodiment, the humidity adjuster 85 is arranged at the downstream side of the temperature adjustment apparatus 76. The humidity of the air is adjusted to a target relative humidity by the humidity adjuster 85 after the temperature of the air passing through the filter apparatus 70 is adjusted to the target temperature by the temperature adjustment apparatus 76. The relative humidity is readily adjusted since the relative humidity of the air, the temperature of which is adjusted, is adjusted.

(5) In the filter apparatus 70 of the first embodiment, the temperature adjustment apparatus 76 includes the apparatus temperature sensor 77 for detecting the temperature of the air and the temperature adjuster 78 for adjusting the temperature of the air based on the detected result of the apparatus temperature sensor 77. The apparatus temperature sensor 77 is arranged at the upstream side of the temperature adjuster 78. The temperature of the air is detected by the apparatus temperature sensor 77 before the air in the filter apparatus 70 passes by the temperature adjuster 78. The temperature of the air is adjusted so as to match the target value based on the detected result by the apparatus temperature sensor 77 when the air passes by the temperature adjuster 78. This improves the adjustment accuracy of the temperature of the air.

(6) The filter apparatus 70 of the first embodiment includes the chemical filter 81 that adsorbs and removes impurities from the air.

The chemical filter 81 prevents the optical capacity of various optical elements from being lowered and suppresses reaction of the resist applied to the wafer with ammonium or amine. This improves the exposure accuracy of the exposure apparatus 10. The slight amount of impurities mixed in the air in the clean room 95 is efficiently removed by the chemical filter 81.

(7) In the filter apparatus 70 of the first embodiment, the chemical filter 81 is formed by combining the activated carbon filter, the impregnated activated carbon filter, and the ion exchange resin filter, or by combining the activated carbon filter and the ion exchange fabric filter (for removing gaseous acid substances), and the ion exchange fabric filter (for removing gaseous alkaline substances). Such combinations remove various organic substances and alkaline substances present in a gaseous state from the air. The chemical filters of activated carbon, the impregnated activated carbon, the ion exchange resin, and the ion exchange fabric are suitable as the chemical filter 81 of the filter apparatus 70 since they are relatively inexpensive and have a stable contaminant removing capacity.

(8) The exposure apparatus 10 of the first embodiment supplies air that has passed through the filter apparatus 70 into the exposure compartment 20, the wafer compartment 24, the reticle loader compartment 40, and the wafer loader compartment 45 of the main body chamber 13.

The air from which the impurities and fine particles (particles) have been removed and which has been adjusted to a substantially constant temperature (target temperature) is supplied to each of the compartments 20, 24, 40, and 45. Therefore, the temperature change in each compartment 20, 24, 40, and 45 is extremely small, and each compartment 20, 24, 40, and 45 is held at the target temperature with satisfactory accuracy. The measurement error of the reticle interferometer 33 and the wafer interferometer 34 caused by the so-called air swaying (temperature change) is suppressed, and the positional control of the reticle stage RST and the wafer stage WST is performed with satisfactory accuracy. As a result, stable exposure accuracy is obtained with the exposure apparatus 10. Since the concentration of impurities and fine particles (particles) in each of the compartments 20, 24, 40, 45 is low, the exposure accuracy of the exposure apparatus 10 is increased, and exposure is performed with satisfactory accuracy even with a fine pattern.

(9) In the exposure apparatus 10 of the first embodiment, the filter apparatus 70 is connected to the main body chamber 13 by the ducts 90a and 90b. In this structure, the exposure apparatus 10 does not have to be formed integrally with the filter apparatus 70 in advance. If the filter apparatus 70 is connected to the main body chamber 13 of the exposure apparatus 10 by the ducts 90a and 90b, the air from which impurities are removed and adjusted to a predetermined temperature is supplied to the inside of the exposure apparatus 10. This improves the versatility of the exposure apparatus 10. Further, temperature change of the air in the exposure apparatus 10 is suppressed, and the temperature of the exposure apparatus 10 may be substantially held at a desired temperature.

Second Embodiment

A structure for drawing air into the main body chamber 13 from the clean room 95 through the filter apparatus 70 and the ducts 90a and 90b is described for the exposure apparatus 10 of the first embodiment. In the second embodiment, an example for applying the filter apparatus 70 of the present invention to the exposure apparatus 10 including the main body chamber 13 and a machine compartment 100 arranged adjacent to the main body chamber 13 will be discussed with reference to FIG. 4.

Figure 4:
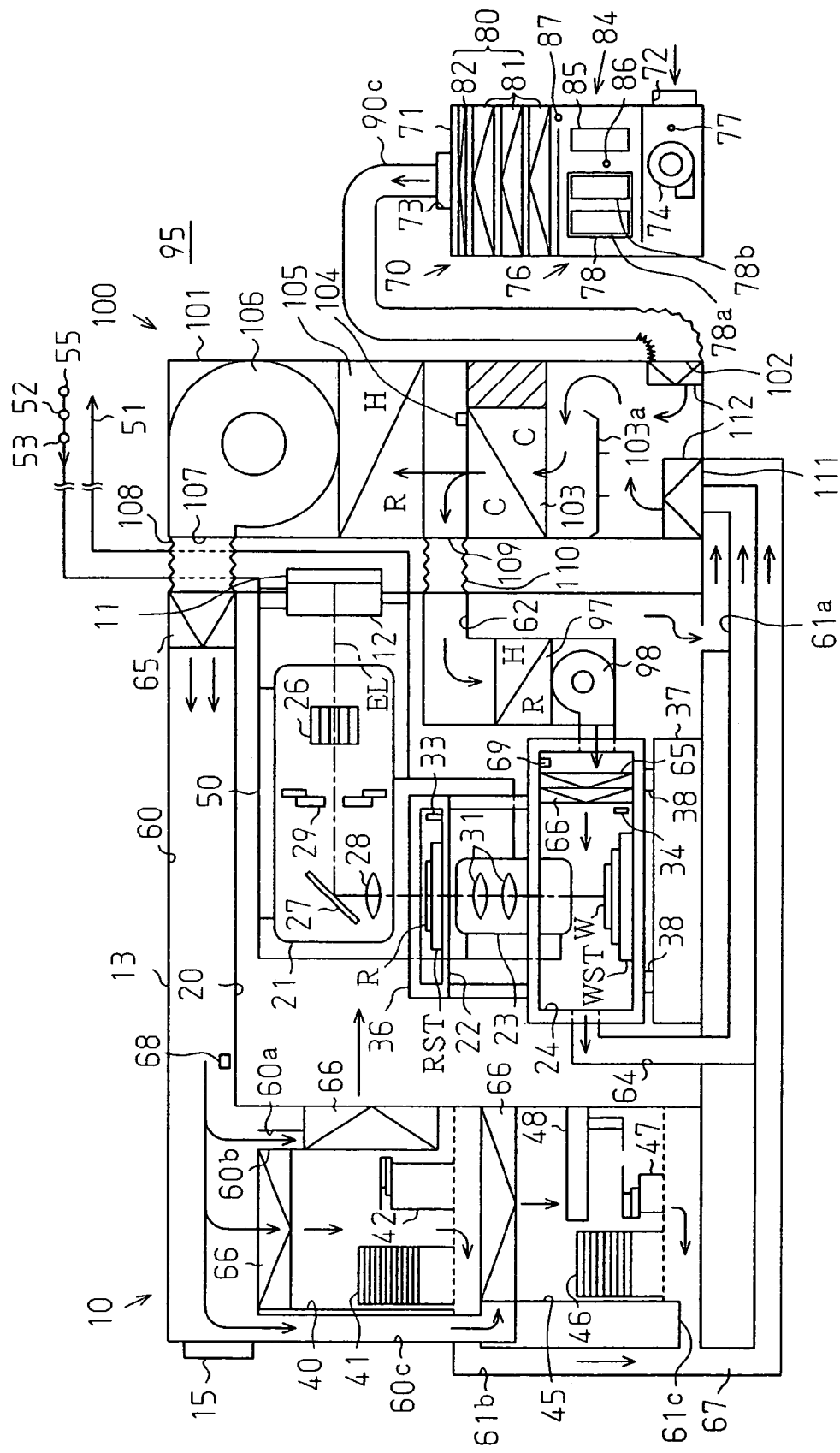
FIG. 4 is a schematic diagram showing a filter apparatus and an exposure apparatus according to a second embodiment of the present invention.

A machine compartment air inlet port 102 for drawing in the air from the filter apparatus 70 is formed in a lower part of the side of a machine compartment main body 101 of the machine compartment 100, as shown in FIG. 4. The machine compartment air inlet port 102 is connected to the discharge port 73 of the filter apparatus 70 by a duct 90c.

A cooler (dry coil) 103 is arranged in the machine compartment main body 101 at a position slightly lower from the center in the height direction. A machine compartment temperature sensor 104 for detecting the temperature of the cooler surface is arranged at an outlet of the cooler 103. The detected value of the machine compartment temperature sensor 104 is provided to the controller 15. A drain pan 103a is arranged below the cooler 103.

A first heater 105 is arranged at a position spaced upward by a predetermined distance from the cooler 103, and a first air blower 106 is arranged above the first heater 105 inside the machine compartment main body 101. A first machine compartment discharge port 107 is formed in the machine compartment main body 101 at a position corresponding to an air outlet of the first air blower 106. The first machine compartment discharge port 107 is connected to the inlet of the guide passage 60 of the exposure apparatus 10 by a guide passage duct 108, which is extensible and accordion-shaped. The air that has passed through the first air blower 106 is drawn into the guide passage 60 of the exposure apparatus 10 through the guide passage duct 108.

Further, a second machine compartment discharge port 109 is formed in the side of the machine compartment main body 101 at a position corresponding to between the cooler 103 and the first heater 105. The second machine compartment discharge port 109 is connected to the entrance of the introducing passage 62 of the exposure apparatus 10 by an introducing passage duct 110, which is extensible and accordion-shaped. Some of the air that has passed through the cooler 103 is drawn into the introducing passage 62 of the exposure apparatus 10 through the introducing passage duct 110. In the second embodiment, the flow amount of the air passing through the introducing passage duct 110 is set to be about ⅕ the flow amount of the air passing through the cooler 103.

A second heater 97 and a second air blower 98 are arranged at the downstream side of the second heater 97 in the introducing passage 62 of the exposure apparatus 10. The second heater 97 and the cooler 103 and first heater 105 of the machine compartment 100 are connected to the controller 15.

The downstream ends of the exhaust passages 61a to 61c of the exposure apparatus 10 and a return passage 64 is connected to the vicinity of the air inlet port 102 in the machine compartment main body 101. A return air inlet port 111 is formed in the machine compartment main body 101 at a position corresponding to the portion connecting the exhaust passages 61a to 61c and the return passage 64.

Two chemical filters 112 are arranged in the machine compartment main body 101 so as to cover the air inlet port 102 and the return air inlet port 111. In the same manner as the chemical filter 81 arranged in the filter apparatus 70, the chemical filter 112 may be made of any material. The chemical filter 81 may be formed from a material used alone or any number of materials used in combination.

In the second embodiment, the filter apparatus 70 is attached to the exposure apparatus 10 including the main body chamber 13 and the machine compartment 100. In this manner, the filter apparatus 70 may be applied to an exposure apparatus that sends the air drawn in from the clean room 95 through the air inlet port 102 of the machine compartment 100 into the main body chamber 13 through the machine compartment 100. Therefore, the filter apparatus 70 of the present invention may be attached to an exposure apparatus that has already been installed in a semiconductor factory.

A humidity adjustment apparatus having a structure similar to that of the humidity adjustment apparatus 84 included in the filter apparatus 70 may be arranged in the machine compartment 100 of the second embodiment. However, when adjusting the humidity of the air in the machine compartment 100 with the humidity adjustment apparatus arranged in the machine compartment 100, the amount of air that is humidity-controlled differs compared to when adjusting the humidity in the filter apparatus 70. When the humidity adjustment apparatus arranged in the machine compartment 100 controls the humidity of the air, the power for such control increases and the humidity adjustment apparatus tends to be larger. Further, the humidity control accuracy may become lower.

Therefore, rather than adjusting the humidity in the machine compartment 100, the attachment of the filter apparatus 70 to the air inlet port 102 of the machine compartment 100 by way of the duct 90c to adjust the humidity of the air in the filter apparatus 70 as in the second embodiment enables the humidity adjustment apparatus to be miniaturized and the humidity control to be performed with high accuracy.

The embodiments of the present invention may be modified as described below.

In the second embodiment, at least one of the cooler 103, the first heater 105 of the machine compartment 100, and the second heater 97 of exposure apparatus 10 may be omitted.

In each embodiment, the filter apparatus 70 may be formed integrally with the exposure apparatus 10. In this manner, the apparatus main body 71 and the ducts 90a to 90c may be omitted, and the number of components for forming the exposure apparatus 10 may be reduced.

In each embodiment, if the room temperature in the clean room 95 is set higher than the target temperature of the main body chamber 13, for example, the heater 78b of the filter apparatus 70 may be omitted.

In each embodiment, at least one of a dehumidifying apparatus for dehumidifying the air circulating through the filter apparatus 70 and a humidifying apparatus for humidifying the air may be arranged in the filter apparatus 70 as the humidity adjuster 85.

In each embodiment, the upstream humidity sensor 86 of the filter apparatus 70 may be arranged at the upstream side of the temperature adjuster 78 at a position corresponding to the apparatus temperature sensor 77. Further, the downstream humidity sensor 87 may be omitted.

In each embodiment, a temperature and humidity sensor for detecting both the temperature and the humidity of the air may be used instead of the apparatus temperature sensor 77 and the humidity sensors 86 and 87 of the filter apparatus 70.

In each embodiment, the humidity sensors 86 and 87 are not limited to detecting the relative humidity of the air. These humidity sensors 86 and 87 may be sensors for detecting the absolute humidity, the wet bulb temperature, or the dew point temperature of the air. Further, the humidity sensors 86 and 87 may be sensors for detecting the ratio (volume ratio) between the partial pressure of the water vapor and the partial pressure of the air, or the ratio (weight ratio) between the weight of the water vapor and the weight of the air.

In each embodiment, the filter apparatus 70 adjusts the temperature and the humidity of the air circulating therein. In addition to the temperature and the humidity, the filter apparatus 70 may be configured so as to adjust the pressure (amount of air sent to the main body chamber 13) in the main body chamber 13.

In each embodiment, the filter apparatus 70 is not limited to an apparatus for supplying air to the main body chamber 13 of the exposure apparatus 10. The filter apparatus of the present invention may supply gas other than air such as purge gas to the main body chamber 13 of the exposure apparatus 10. In this case, the filter apparatus may be connected to a supply pipe 50 connected to the BMU compartment 12a, the illumination system barrel 21, and the projection system barrel 23 of the exposure apparatus 10. In such a structure, a dryer for removing the moisture in the purge gas discharged from the filter apparatus is desirably arranged at the downstream side of the filter apparatus in the supply pipe 50.

In each embodiment, a HEPA (High Efficiently Particulate Air-filter) may be used instead of the ULPA filter 82 of the filter apparatus 70 or the ULPA filter of the filter boxes 66 and 67 of the exposure apparatus 10.

In each embodiment, the chemical filter 81 of the filter apparatus 70, the chemical filter 65 of the exposure apparatus 10, the chemical filter of the upstream filter box 66, and the chemical filter 112 of the machine compartment 100 may have any thickness and filling density.

The thickness and/or filling density of each chemical filter may be changed so that the amount of moisture exchanged between each chemical filter and the air passing through the chemical filter decreases as it approaches the main body column 36 of the exposure apparatus 10. In this case, each chemical filter is formed so that the thickness and/or the filling density increases in the order of the chemical filter of the main body chamber 13, the chemical filter of the machine compartment main body 101, and the chemical filter of the apparatus main body 71.

In each embodiment, the first filter apparatus for supplying air into the guide passage 60 and the second filter apparatus for drawing air into the introducing passage 62 of the exposure apparatus 10 may be connected to the exposure apparatus 10. In this way, the condition (temperature and humidity) of the air circulating through the guide passage 60 and the condition (temperature and humidity) of the air circulating through the introducing passage 62 may be individually adjusted.

In each embodiment, the exposure apparatus 10 and the filter apparatus 70 may be formed so that at least some of the air discharged out of the main body chamber 13 through the exhaust passages 61a to 61c and the exhaust passage 63 (first embodiment) and the return passage 64 (second embodiment) of the exposure apparatus 10 directly flows into the filter apparatus 70. That is, some of the air in the main body chamber 13 may circulate through the inside of the main body chamber 13 and the inside of the filter apparatus 70. In this case, a duct connects an air discharge portion of the main body chamber 13 to the filter apparatus 70. It is desirable that the duct be made of a material, such as stainless steel (SUS) or fluorinated resin, which produce a small amount of contaminants that would collect on the surface of various optical elements and lower the optical capacities of the optical elements.

In each embodiment, the exposure apparatus 10 is not limited to an apparatus including a main body column 36 in the main body chamber 13. The exposure apparatus 10 may be an apparatus in which the reticle compartment 22 and the wafer compartment 24 are arranged in different chambers and the projection system barrel 23 is arranged between the chambers.

The projection optical system is not limited to a refraction type and may be a catadioptric type or a reflection type. The present invention may also be applied in the same manner to an exposure apparatus that does not have a projection optical system, such as, a contact exposure apparatus in which the mask and the substrate are closely contacted and the pattern of the mask is transferring onto the substrate, or a proximity exposure apparatus in which the mask and the substrate are brought close to each other to transfer the pattern of the mask.

The exposure apparatus of the present invention is not limited to a reduction exposure type exposure apparatus and may be an equal exposure type or enlargement exposure type exposure apparatus.

In addition to micro devices such as semiconductor devices, the present invention may also be applied to an exposure apparatus for transferring a circuit pattern from a mother reticle to a glass substrate or silicon wafer to manufacture reticles or masks, such as a light exposure apparatus, EUV exposure apparatus, X-ray exposure apparatus, or electron ray exposure apparatus. A transmissive reticle is generally used in an exposure apparatus using DUV (deep ultraviolet) or VUV (vacuum ultraviolet) light. Further, quartz glass, quartz glass doped with fluorine, fluorite, magnesium fluoride, or crystal may be used for the reticle substrate. For instance, in the proximity type X-ray exposure apparatus or the electron ray exposure apparatus, the transmissive mask (stencil mask, membrane mask) is used, and silicon wafer is used as the mask substrate.

In addition to an exposure apparatus used for manufacturing semiconductor devices, the present invention may also be applied to the following exposure apparatuss. For instance, the present invention may be applied to an exposure apparatus used in manufacturing displays including a liquid crystal display (LCD) for transferring the device pattern onto the glass plate. Further, the present invention may also be applied to an exposure apparatus used for manufacturing a thin-film magnetic head and the like for transferring a device pattern onto the ceramic wafer. The present invention is also applicable to the exposure apparatus used in manufacturing an imaging element of a CCD.

The present invention may also be applied to a simultaneous exposure type exposure apparatus employing the step-and-repeat method in which the pattern of a mask is transferred to the substrate when the mask and the substrate are held in a stationary state and the substrate is moved sequentially in steps.

A g-line ($\lambda$=436 nm), i-line ($\lambda$=365 nm), ArF excimer laser ($\lambda$=193 nm), $F_2$ laser ($\lambda$=157 nm), $Kr_2$ laser ($\lambda$=146 nm), $Ar_2$ laser ($\lambda$=126 nm) may be used as the light source of the exposure apparatus. Further, a harmonic wave in which a single wavelength laser in the infrared range or visible range oscillated from a DFB semiconductor laser or a fiber laser may be amplified with a fiber amplifier doped with erbium (or both erbium and ytterbium), and the amplified laser light may be wave-converted to the ultraviolet light using a non-linear optical crystalline as the light source.

The exposure apparatus 10 of the present embodiment is manufactured in the following manner.

First, a plurality of lens elements 31 and a cover glass forming the projection optical system are accommodated in the projection system barrel 23. The illumination optical system formed by optical members such as a mirror 27 and lenses 26 and 28 are accommodated in the illumination system barrel 21. The illumination optical system and the projection optical system are incorporated in the main body chamber 13 to conduct optical adjustment. Subsequently, the wafer stage WST (also reticle stage RST in case of scan type exposure apparatus) including a large number of mechanical components is attached to the main body chamber 13 and wirings are connected. After the supply pipe 50 and the discharge pipe 51 are connected to the BMU compartment 12a, the illumination system barrel 21, and the projection system barrel 23, and the filter apparatus 70 are connected to the main body chamber 13 by the ducts 90a and 90b, total adjustment (electrical adjustment, operation check etc.) is performed.

The components forming the barrel 21 and 23 are assembled after impurities, such as machining oil and metal substances, are removed through ultrasonic cleaning. It is desirable that the manufacturing of the exposure apparatus 10 be performed in a clean room in which temperature, humidity, and air pressure are controlled and the cleanliness is adjusted.

An embodiment of a method for manufacturing a device when using the above described exposure apparatus 10 in a lithography step will now be described.

Figure 5:
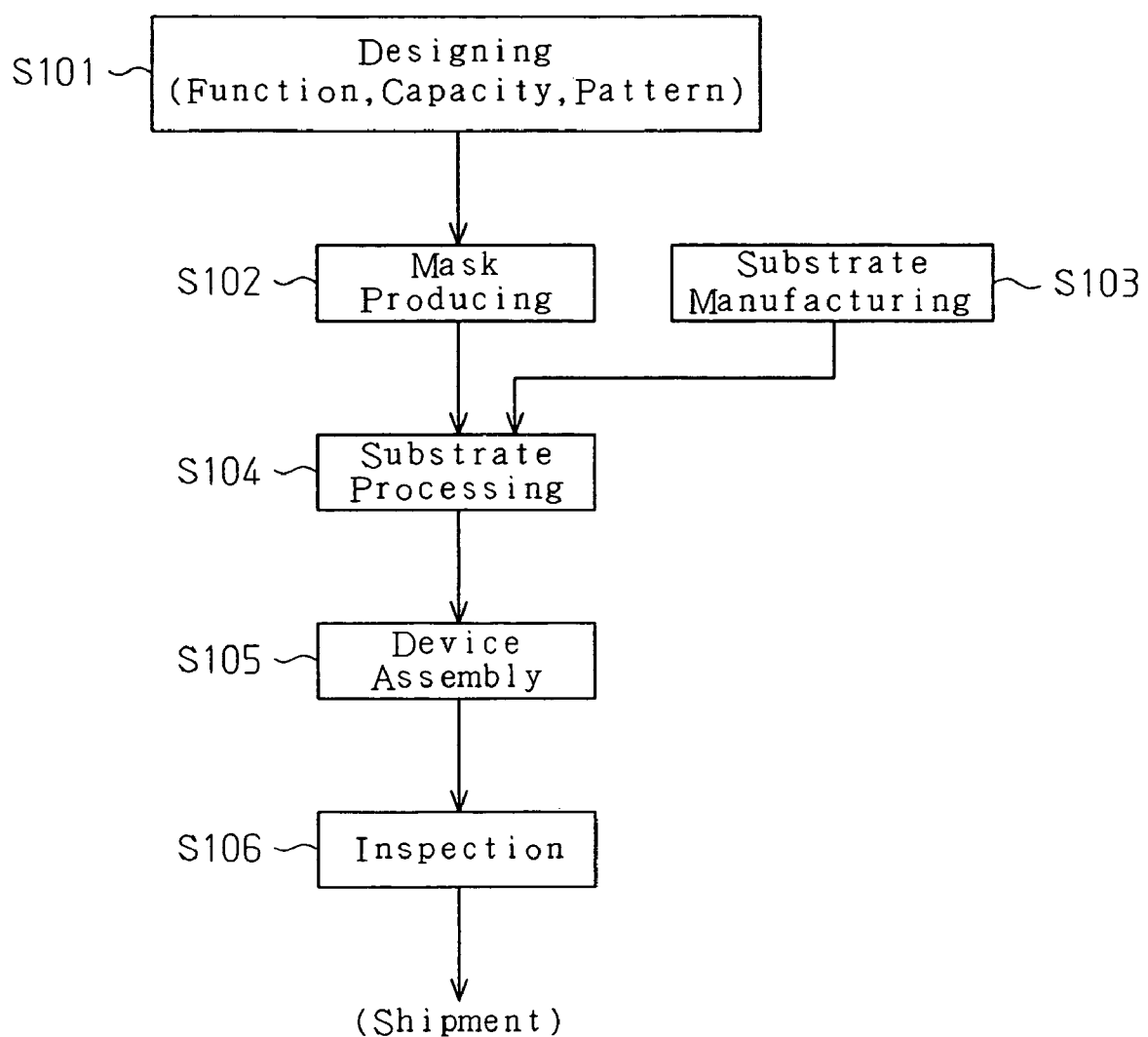
FIG. 5 is a flowchart showing a method for manufacturing a device with the exposure apparatus of the present invention.

FIG. 5 is a flowchart showing an example for manufacturing a device (e.g., semiconductor element such as IC, LSI, etc., liquid crystal display element, imaging element (e.g., CCD), thin-film magnetic head, micro-machine).

As shown in FIG. 5, the function and performance designing (e.g., circuit designing of semiconductor device) of the device (micro-device) is performed in step S101 (designing step), and pattern designing is performed to realize the function. Thereafter, a mask (reticle R etc.) having the designed circuit pattern is produced in step S102 (mask producing step). In step S103 (substrate manufacturing step), the substrate is manufactured using materials such as silicon and glass plate (wafer W is manufactured when a silicon material is used).

In step S104 (substrate processing step), the actual circuit etc. is formed on the substrate with the lithography technique, as will be described later, using the mask and the substrate prepared in steps S101 to S103. In step S105 (device assembly step), device assembly is performed using the substrate processed in step 104. If necessary, step 105 may include a plurality of steps, such as a dicing step, a bonding step, and a packaging step (chip enclosure etc.).

Finally, in step S106 (inspection step), examinations, such as the operation check test and durability test are conducted on the device produced in step S105. The device is then completed after the above steps and shipped out of the factory in this state.

Figure 6:
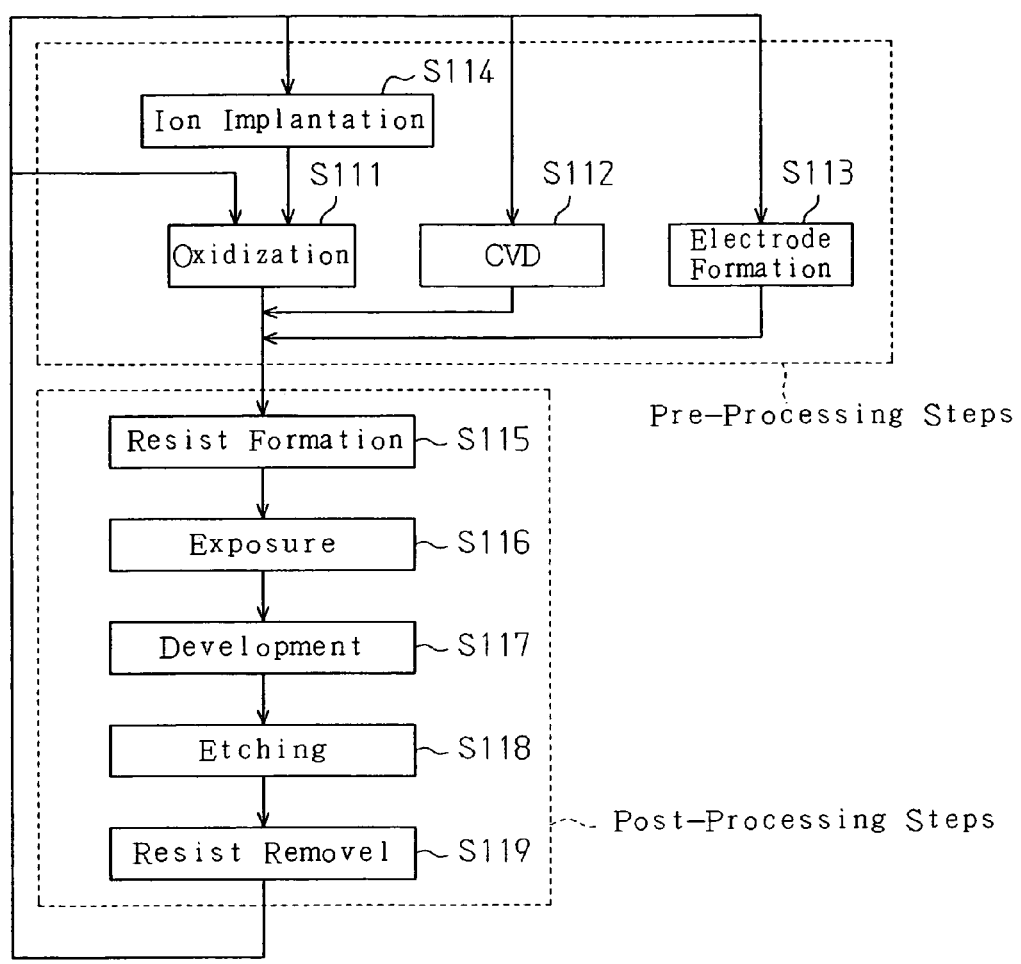
FIG. 6 is a flowchart showing a method for manufacturing a semiconductor element with the exposure apparatus of the present invention.

FIG. 6 shows one example of a detailed flowchart of step S104 of FIG. 5 for a semiconductor device. In FIG. 6, the surface of the wafer W is oxidized in step S111 (oxidization step). In step S112 (CVD step), the insulation film is formed on the surface of the wafer W. In step S113 (electrode formation step), the electrode is formed on the wafer W through deposition. In step S114 (ion implantation step), ions are implanted into the wafer W. Each of the above steps Sill to S114 constitute pre-processing steps of each stage during wafer processing, and are selected and executed in accordance with the processing necessary in each stage.

In each stage of the wafer process, after the above pre-processing steps are completed, the subsequent post-processing steps are performed. In the post-processing steps, the photosensitive agent is first applied to the wafer W in step S115 (resist formation step). In step S116 (exposing step), the circuit pattern of the mask (reticle R) is transferred onto the wafer W through the lithography system (exposure apparatus) described above. In step S117 (developing step), the exposed wafer W is developed, and in step S118 (etching step), portions of the wafer W, excluding portions where the resist remains, are removed through etching. In step S119 (resist removal step), the unnecessary resist after etching is removed.

The pre-processing steps and the post-processing steps are repeatedly performed to form pluralities of circuit patterns on the wafer W.

Through the method for manufacturing the device of the present embodiment described above, resolution is enhanced by the exposure light EL of vacuum ultraviolet region. Further, exposing amount control is performed with high accuracy in the exposure step (step S116). Therefore, a device that enhances exposure accuracy and has a high integration with a minimum line width of about 0.1 μm is manufactured with satisfactory yield.

Although only two embodiments of the present invention and their modifications have been described above, it should be apparent to those skilled in the art that the present invention may be embodied in many other specific forms without departing from the spirit or scope of the invention.

The invention claimed is:
1. A filter apparatus comprising:
a main body having an inlet port to draw in an outside gas and a discharge port to discharge the drawn gas;
a filter arranged inside the main body and between the inlet port and the outlet port and configured to remove impurities contained in the gas;
a temperature adjustment apparatus arranged inside the main body and configured to adjust the temperature of the gas to a predetermined temperature;
a humidity detection system arranged inside the main body and configured to detect the humidity of the gas before the gas passes through the filter; and
a humidity adjustor arranged inside the main body and connected to the humidity detection system and configured to adjust the humidity of the gas before the gas passes through the filter based on the detection result of the humidity detection system, wherein the temperature adjustment apparatus, the humidity detection system, and the humidity adjustor are arranaed between the filter and the inlet port.

2. The filter apparatus according to claim 1, wherein the humidity detection system includes a humidity sensor arranged at the upstream side of the filter.

3. The filter apparatus according to claim 1, wherein the humidity detection system includes a humidity sensor arranged between the filter and the humidity adjustor.

4. The filter apparatus according to claim 1, wherein the humidity adjuster is arranged at the downstream side of the temperature adjustment apparatus.

5. The filter apparatus according to claim 1, wherein the humidity adjuster includes at least one of a humidifying apparatus that humidifies the gas and a dehumidifying apparatus that dehumidifies the gas.

6. The filter apparatus according to claim 1, wherein the temperature adjustment apparatus includes a temperature sensor configured to detect the temperature of the gas, and a temperature adjuster, arranged at the downstream side of the temperature sensor, for adjusting the temperature of the gas based on the detection result of the temperature sensor.

7. The filter apparatus according to claim 1, wherein the filter removes from the gas contaminants that would collect on a surface of an optical element and lower optical capacity of the optical element.

8. The filter apparatus according to claim 1, wherein the filter removes an alkaline substance that reacts with photosensitive material applied to a substrate.

9. The filter apparatus according to claim 7, wherein the filter is a chemical filter enabling adsorption of gaseous contaminants.

10. An exposure apparatus for forming a pattern on a substrate, the exposure apparatus comprising:
a filter apparatus configured to draw in gas from a clean room, the filter apparatus including a main body having an inlet port to draw in an outside gas and a discharge port to discharge the drawn gas, a filter that is arranged inside the main body and between the inlet port and the outlet port and removes impurities from the gas, a temperature adjustment apparatus that is arranged inside the main body and adjusts the temperature of the gas to a predetermined temperature, a humidity detection system that is arranged inside the main body and detects the humidity of the gas before the gas passes through the filter, and a humidity adjustor that is arranged inside the main body and adjusts the humidity of the gas before the gas passes through the filter based on the detection result of the humidity detection system, wherein the temperature adjustment apparatus, the humidity detection system, and the humidity adjustor are arranged between the filter and the inlet port.

11. The exposure apparatus according to claim 10, further comprising:
an exposure apparatus main body configured to form the pattern on the substrate; and
a chamber configured to accommodate the exposure apparatus main body and including an ambient air inlet port, the filter apparatus being connected to the ambient air inlet port of the chamber.

12. An exposure system comprising:
an exposure apparatus configured to form an image on a substrate; and
a filter apparatus configured to draw in gas from a clean room and supply the drawn in gas to the exposure apparatus, wherein the filter apparatus includes a main body having an inlet port to draw in an outside gas and a discharge port to discharge the drawn gas, a filter that is arranged inside the main body and between the inlet port and the outlet port and removes impurities from the gas, a temperature adjustment apparatus that is arranged inside the main body and adjusts the temperature of the gas to a predetermined temperature, a humidity detection system that is arranged inside the main body and detects the humidity of the gas before the gas passes through the filter, and a humidity adjustor that is arranaed inside the main body and adjusts the humidity of the gas before the gas passes through the filter based on the detection result of the humidity detection system, wherein the temperature adjustment apparatus, the humidity detection system, and the humidity adjustor are arranged between the filter and the inlet port.

13. The exposure system according to claim 12, wherein:
the humidity detection system includes at least one of a first humidity sensor arranged at the upstream side of the humidity adjustor and a second humidity sensor arranged at the downstream side of the humidity adjustor; and
the exposure apparatus includes a controller connected to the temperature adjuster and the at least one of the first humidity sensor and the second humidity sensor, the controller activating the humidity adjuster based on the humidity of the gas detected by the at least one of the first humidity sensor and the second humidity sensor.

14. A device manufacturing method including a lithography step, the method characterized by the step of:
performing exposure in the lithography step with the exposure apparatus according to claim 10.

15. The filter apparatus according to claim 1, wherein the humidity detection system includes a first humidity sensor arranged at the upstream side of the humidity adjustor and a second humidity sensor arranged at the downstream side of the humidity adjustor.

16. The filter apparatus according to claim 3, wherein the humidity sensor detects whether the humidity of the gas that has been adjusted by the humidity adjustor is adjusted to a target value.

17. The filter apparatus according to claim 1, wherein the filter has a function of changing temperature of the gas between before and after the gas passes through the filter by means of changing humidity of the gas between before and after the gas passes through the filter.

18. The filter apparatus according to claim 1, wherein:
the inlet port is configured to draw in the gas of a clean room; and
the discharge port is configured to discharge the drawn gas to an exposure apparatus main body.

19. The filter apparatus according to claim 18, further comprising:
a fan that draws in the gas through the inlet port and sends the drawn in gas to the discharge port.

20. The filter apparatus according to claim 19, wherein the filter, the temperature adjustment apparatus, the humidity detection system, the humidity adjustor, and the fan are arranged along a circulation direction of the gas in the order of the fan, the temperature adjustment apparatus, the humidity adjustor, the humidity detection system, and the filter.

21. The filter apparatus according to claim 18, wherein the temperature adjustment apparatus includes a temperature sensor configured to detect the temperature of the drawn in gas and adjusts the temperature of the gas based on the detection result of the temperature sensor.

22. The exposure apparatus according to claim 10, wherein the humidity detection system includes a humidity sensor arranged at the upstream side of the humidity adjustor.

23. The exposure apparatus according to claim 10, wherein the humidity detection system includes a humidity sensor arranged between the filter and the humidity adjustor.

24. The exposure apparatus according to claim 10, wherein the temperature adjustment apparatus includes:
   a temperature sensor that detects the temperature of the gas; and
   a temperature adjuster that adjusts the temperature of the gas based on the detection result of the temperature sensor and is arranged at the downstream side of the temperature sensor.

* * * * *